Nov. 3, 1970 F. J. ARKELL ET AL 3,538,442

HIGH SPEED DIGITAL DIVIDER

Filed Aug. 8, 1967 4 Sheets-Sheet 1

Inventors
FRANK J. ARKELL
JOSEPH P. MORAN
BY
Mueller, Aichele & Rauner
ATTYS.

HIGH SPEED DIGITAL DIVIDER 3,538,442

HIGH SPEED DIGITAL DIVIDER

Frank J. Arkell, Glenview, and Joseph P. Moran, Chicago, Ill., assignors to Motorola, Inc., Franklin Park, Ill., a corporation of Illinois Filed Aug. 8, 1967, Ser. No. 659,164
Int. Cl. H03k *29/00*
U.S. Cl. 328—39 10 Claims

ABSTRACT OF THE DISCLOSURE

A continuously operating high speed counter having a plurality of outputs reducing the frequency of an incoming signal. A low speed counter circuit coupled to the high speed counter counts from a preset starting number to a terminal number. Upon reaching the terminal number the low speed counter acts to select a desired output of the high speed counter and develops an output signal when the high speed counter reaches the stage coupled to the outputs selected. The selection is made so that the ratio between the frequency of the signal and the input signal is a particular value. This ratio can be varied by varying the preset conditions of the divider.

BACKGROUND OF THE INVENTION

Conventional digital frequency dividers operate by using a variable counter in which continuous forward counting is stopped to force the counter to a predetermined number. Because of the limitations of available components the maximum operating speed of such a counter approaches 25 megacycles and therefor it is not usable where it is desirable to divided input frequencies of tthe order of 70 to 100 megacycles. High speed dividers in the 70 to 100 megacycle range can be built using available components but the division ratio is not variable.

SUMMARY OF THE INVENTION

It is therefore an object of this invention to provide an improved frequency divider circuit operative at input frequencies very much greater than 25 megacycles.

Another object of this invention is to provide such a divider circuit in which the division ratio is variable.

In practice this invention a variable divider is provided having a high speed counter which operates continuously to reduce the frequency of the incoming signal. The high speed counter has a plurality of outputs which are coupled to the divider output through output gating circuits. A low speed counter is coupled to the high speed counter and operates logic circuitry to select a particular output circuit at a predetermined time to produce an output signal, the frequency of which has a fixed ratio to the frequency of the input signal. By varying the preset conditions of the logic circuitry and the low speed counter, this ratio can be varied as desired. Thus only the low speed counter is stopped while the high speed counter runs continuously.

The invention is illustrated in the drawings wherein.

DESCRIPTION OF THE INVENTION

Figure 1:
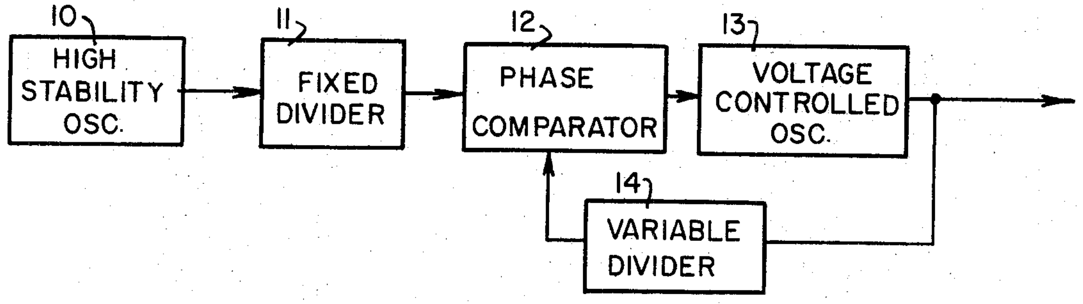
FIG. 1 is a block diagram showing the use of a variable divider of the type described in this invention in a frequency synthesizer circuit.

In FIG. 1 there is shown a frequency synthesizer circuit which uses a variable divider. A frequency synthesizer uses a high stability oscillator 10 having a fixed frequency to generate a plurality of output frequencies with each output frequency locked to the high stability oscillator. The output of high stability oscillator 10 is coupled to a fixed divider 11 and a phase comparator 12 where it is compared with the output signal from variable divider 14. A D.C. output voltage from phase comparator 12 regulates voltage controlled oscillator 13 so that the ratio of the frequency of the signal from voltage controlled oscillator 13 to the frequency of the signal from high stability oscillator 10 has a fixed value. This value is controlled by the division ratios of fixed divider 11 and variable divider 14. Thus by changing the value of the division ratio of variable divider 14, the output frequency of the synthesizer can be changed. The output frequency from voltage controlled oscillator 13 is highly stable as it is locked to the signal from high stability oscillator 10.

Figure 2:
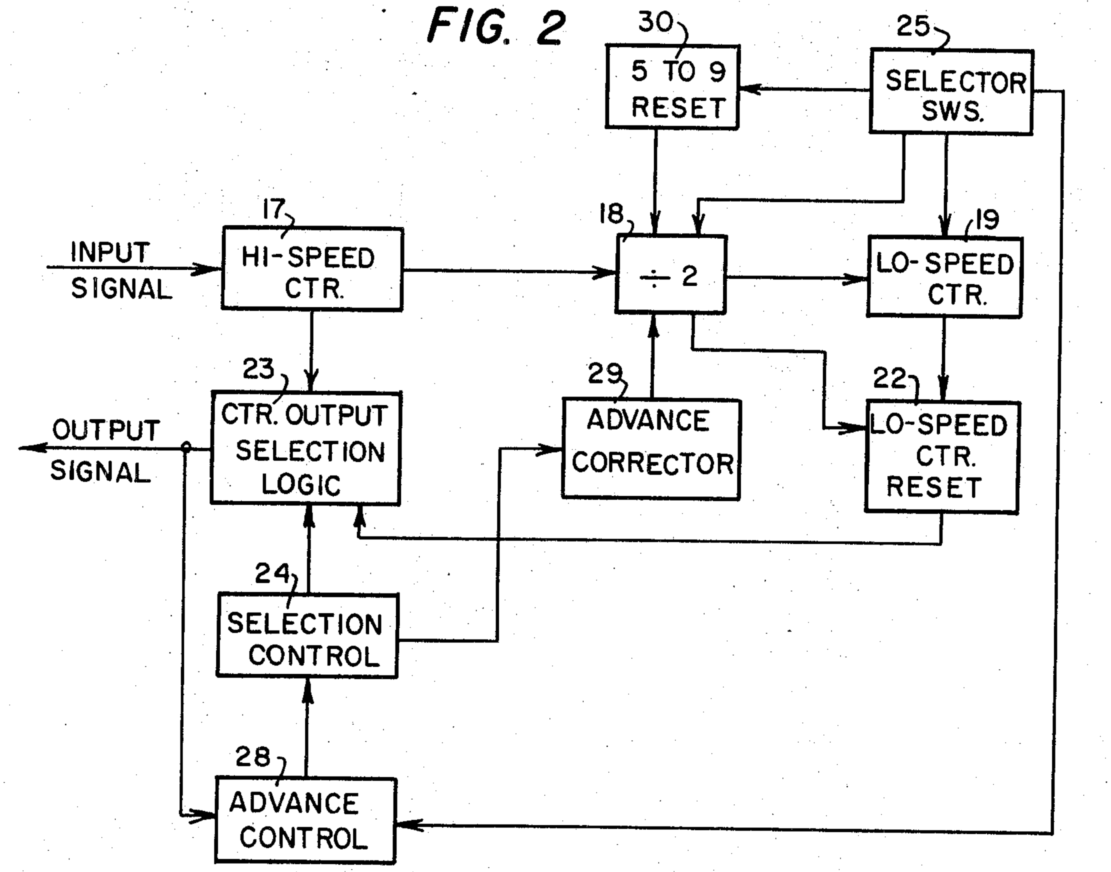
FIG. 2 is a block diagram of the variable divider of FIG. 1.

Referring to FIG. 2, there is shown the variable divider of FIG. 1. The input signal is applied to high speed counter 17 where it is divided down by a fixed ratio and coupled to divide by two circuit 18. The output signal from divide by two circuit 18 is coupled to low speed counter 19. Low speed counter 19 has been preset to a particular number and counts the output signal from divide by two circuit 18. Upon reaching a terminal count low speed counter 19 actuates reset 22 which in turn actuates the counter output selection logic circuitry 23.

High speed counter 17 has a plurality of output circuits which are gated by counter output selection logic 23 controlled by selection control 24. Thus when a pulse is received from low speed counter reset 22, a particular one of the plurality of output circuits of high speed counter 17 is enabled and when high speed counter 17 reaches the stage coupled to the selected output circuit an output signal is developed. The particular output circuit enabled by selection logic 23 may be changed for each output pulse and this is accomplished by selection control 24 operated by advance control 28.

In the particular example of the circuit of this invention described herein, high speed counter 17 counts by five and therefore in order to achieve division ratios from 5 to 9 it is necessary to delay the operation of low speed counter 19 by one count. This is accomplished by 5 to 9 reset 30 coupled to divide by two counter 18. Selector switches 25 coupled to 5 to 9 reset 30, divide by two counter 18, low speed counter 19 and advance control 28 preset these circuit elements to achieve the desired division ratio. Selector switches 25 can also be calibrated in frequency so that by setting them to the desired frequency the variable divider will have the proper ratio to achieve a desired output frequency in a circuit such as is shown in FIG. 1.

Figure 3:
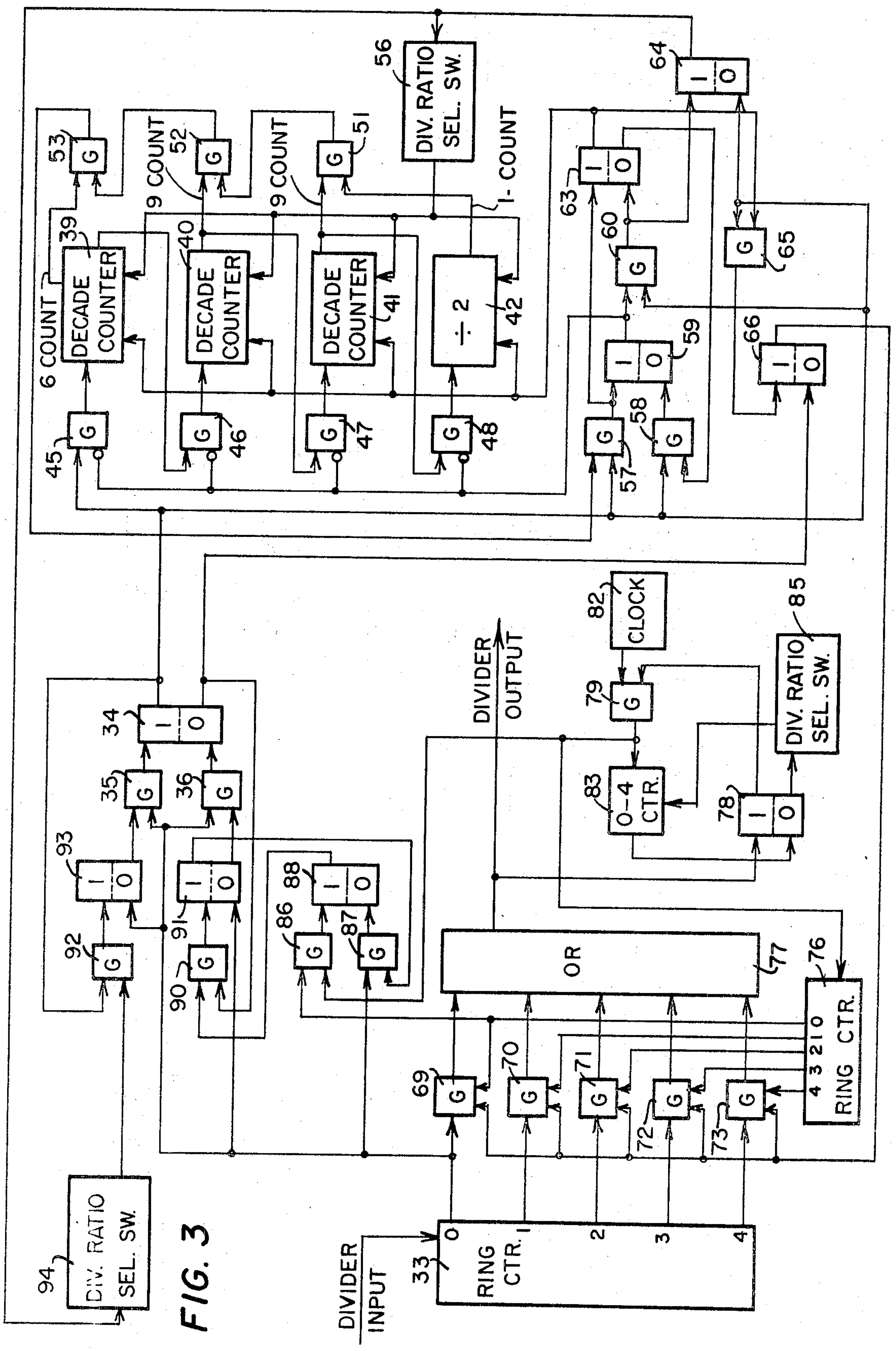
FIG. 3 is a block diagram of the variable divider of FIG. 2 shown in more detail.

Referring to FIG. 3, the input signal to be divided in frequency is coupled to ring counter 33. Ring counter 33 is a high speed ring counter and counters of this type operating at speeds in excess of 100 megacycles are well known. As ring counter 33 counts through five counts, outputs appear at each of the output lines labeled zero to four. Each time the count reaches zero, that is every fifth count, a count pulse is coupled to J–K flip-flop 34 through gates 35 and 36. J–K flip-flop 34 and gates 35 and 36 are coupled in a known manner to achieve toggle operation so that J–K flip-flop 34 alternates between the "0" and "1" states. Thus J–K flip-flop 34 acts as a divide by two counter.

The output of J–K flip-flop 34 is coupled to the low speed counter which consists of decade counters 39, 40, 41 and divide by two counter 42. J–K flip-flop 34 is coupled to decade counter 39 through gate 45. The output of decade counter 39 is coupled to decade counter 40 through gate 46 and the output of decade counter 40 is coupled to decade counter 41 through gate 47. The output of decade counter 41 is coupled to divide by two counter 42 through gate 48. The three decade counters 39, 40 and 41 and divide by two counter 42 can count from zero to 1999. However, several counts are needed at the end of the counting period to operate the logic circuitry so that a terminal pulse is generated on the 1996 count. This is accomplished by gates 51, 52 and 53 which are coupled together in the manner shown so that when the low speed counter reaches the count 1996 an output is developed from gate 53.

The output of gate 53 enables gate 57 so that the next pulse from J–K flip-flop 34 shifts J–K flip-flop 59 to its "1" state and also shifts J–K flip-flop 63 to its "1" state. J–K flip-flop 59 is an inhibiting circuit and applies an inhibiting signal to gates 45, 46, 47 and 48 to prevent additional counts from being recorded by the low speed counter. The output of J–K flip-flop 59 also enables gate 60.

With gate 60 enabled the next pulse from J–K flip-flop 34 shifts J–K flip-flop 63 to its "0" state. With J–K flip-flop 63 in its "1" state a clear signal is applied to decade counters 39, 40, 41 and divide by two counter 42 to preset the low speed counter to a fixed number. This step is necessary so that the subsequent step of presetting the low speed counter will not cause false signals to be developed .

The pulse from gate 60 which returns J–K flip-flop 63 to its "0" state also shifts J–K flip-flop 64 to its "1" state. The set signal from J–K flip-flop 64 is coupled through division ratio selector switches 56 to decade counters 39, 40, 41 and divide by two counter 42 to preset the counter to a desired number depending upon the division ratio of the variable divider. The preset number in the low speed counter is determined by the position of the division ratio selector switch 56 and can be changed to vary the divisional ratio. The next output signal from J–K flip-flop 34 returns set J–K flip flop 64 to its "0" state. The same signal from J–K flip-flop 34 is coupled through gate 58, which has been enabled by J–K flip-flop 63 in its "0" state, to reset the inhibiting J–K flip-flop 59 to its "0" state removing the inhibiting signal from gates 45 to 48. At this point the low speed counter is again ready to accept input pulses from J–K flip-flop 34 and resume its counting sequence.

The output signal from J–K flip-flop 63 in its "1" state enables gate 65 so that the next pulse from the J–K flip-flop 34 shifts J–K flip-flop 66 to its "1" state. J–K flip-flop 66 is returned to its "0" state by a signal from J–K flip-flop 34 in its "0" state. Since J–K flip-flop 34 changes states every five input pulses, J–K flip-flop 66 remains in the "1" state for five input pulses.

The output from J–K flip-flop 66 in its "1" state enables AND gates 66 to 73 which are coupled to the various outputs of the high speed ring counter 33. Ring counter 76 is shifted to a particular position by clock pulse from clock 82 coupled through gate 79. Thus the output from ring counter 76 enables a single one of the gates 69 to 73 and when ring counter 33 reaches this particular position an output signal is coupled to OR gate 77. This is the divider output signal.

If the division ratio is divisible by 5, the desired output circuit of ring counter 33 will remain the same so that it will not be necessary to advance ring counter 76. However, if, for example, the desired division ratio ends in three it will be necessary to advance ring counter 76 three counts each counting period. Each time an output pulse is developed it is coupled from OR gate 77 to J–K flip-flop 78 setting this flip-flop in its "1" state. J–K flip-flop 78 in its "1" state enables gate 79 permitting clock pulses to be coupled to ring counter 76 and 0 to 4 counter 83. 0 to 4 counter 83 is preset by the division ratio selector switch 85 to a number depending upon the last digit to be counted. When counter 83 reaches its fourth count an output signal is developed which shifts J–K flip-flop 78 to its "0" state disabling gate 79 and stopping the clock pulse from clock 82. Thus at the beginning of each counting period ring counter 76 is advanced by the required number of counts to select the proper output gate.

Each time ring counter 76 counts five counts additional five counts must be added to the numbers counted by the low speed counter. This is accomplished by J–K flip-flops 88 and 91 and gates 86, 87 and 90. As ring counter 76 reaches its "0" state gate 86 is enabled and clock pulses from clock 82 shift J–K flop-flop 88 to its "1" state. J–K flip-flop 88 in its "1" state enables gate 90 so that the subsequent shift of J–K flip-flop 34 from its "0" to its "1" state causes J–K flip-flop 91 to be shifted to its "1" state. With J–K flip-flop 91 in its "1" state, gate 36 is no longer enabled so that the next count pulse from high speed ring counter 33 will not cause J–K flip-flop 34 to shift back to its "0" state. However, the output pulse from J–K flip-flop 91 enables gate 87 so that this pulse will cause J–K flip-flop 88 to return to its "0" state and will also shift J–K flip-flop 91 back to its "0" state, again enabling gate 36. The subsequent pulse from ring counter 33 toggles J–K flip-flop 34 shifting it back to its "0" state. Thus the operation of J–K flip-flop 34 is delayed by five counts as required.

If it is desired to divide by a number ending in an integer greater than four, that is 5 to 9, it is necessary to add an additional five counts to the number counted by the low speed counter each counting period. These five counts are in addition to those which are periodically added by ring counter 76 advancing through zero. When it is desired to divide by a ratio ending in the numbers 5 to 9, division ratio selector switch 94 is closed so that the output pulse from J–K flip-flop 64 in its "1" state is coupled to gate 92 enabling this gate. The subsequent output pulse from J–K flip-flop 34 is coupled to J–F flip-flop 93 pulse J–K flip-flop 93 to its "1" state. With J–K flip-flop 93 in its "1" state gate 35 is disabled so that the subsequent count pulse from ring counter 33 cannot toggle J–K flip-flop 34 back to its "1" state and thus the output of J–K flip-flop 34 is delayed by five counts. However this same output pulse from ring counter 33 acts to shift J–K flip-flop 93 back to its "0" state so that the following output pulse from ring counter 33 will toggle J–K flip-flop 34.

Figure 4:
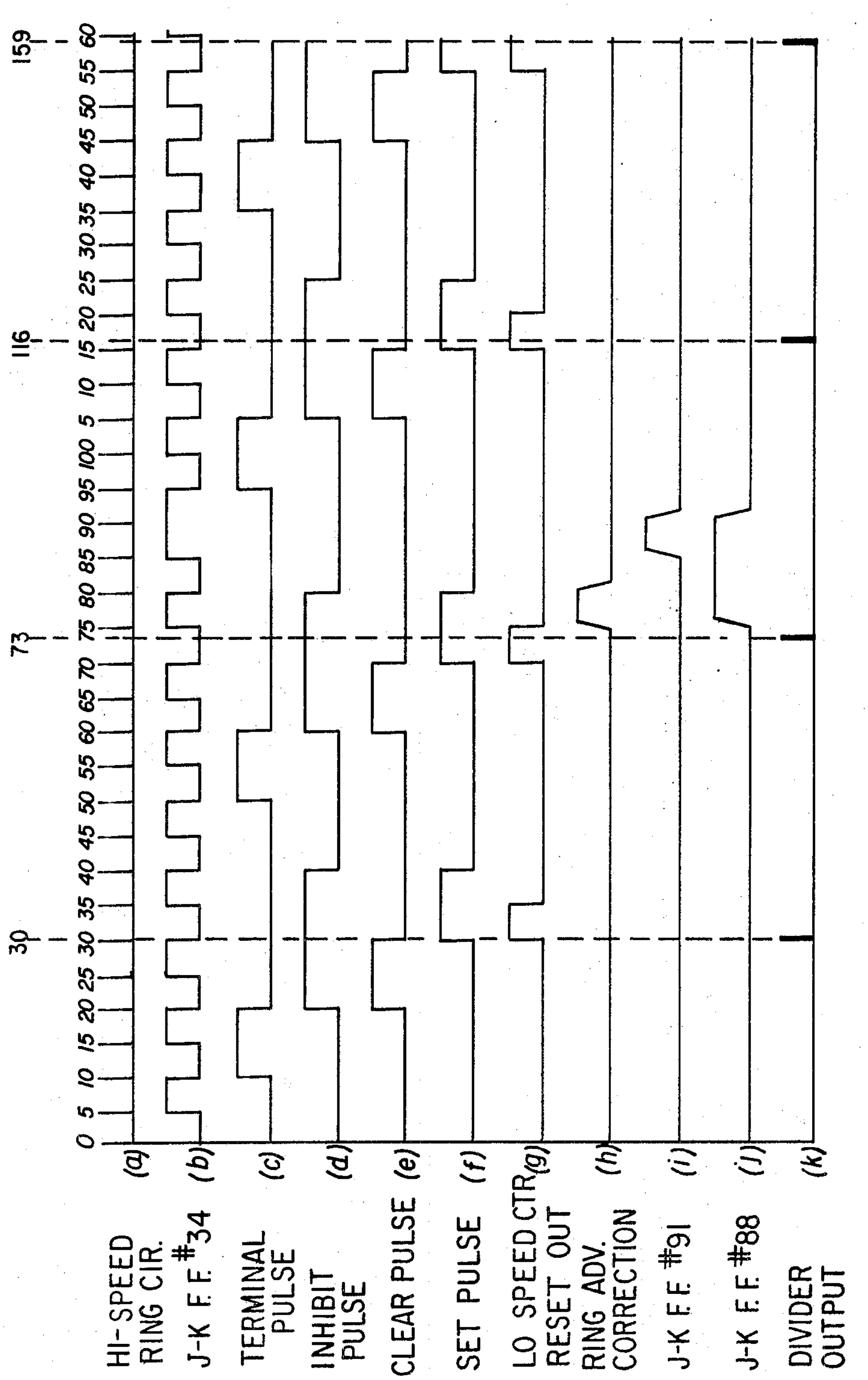
FIGS. 4 and 5 are timing diagrams illustrating the operation of the variable divider of FIG. 3.

Referring to FIG. 4 there are shown timing diagrams illustrating the operation of the circuitry of FIG. 3 for a division ratio of 43. As shown in line (*a*), every five input pulses a count pulse is developed by high speed ring counter 33 which is coupled to J–K flip-flop 34. Thus, as shown in line (*b*), J–K flip-flop 34 toggles or shifts states every five counts except under certain conditions which will be described subsequently. The flip-flops used in these circuits operate dynamically so that an output signal from J–K flip-flop 34 upon its shift from its "1" to its "0" state is coupled to the low speed counter.

For a division ratio of 43, the low speed counter is preset so that a terminal pulse is generated at the end of ten input counts, line (*c*). This terminal pulse remains for ten counts at the end of which time the inhibit pulse is actuated, as shown in line (*d*). The clear pulse is also generated at the same time as the inhibit pulse, as shown in line (*e*). At the termination of the clear pulse a set pulse is developed, as shown on line (*f*), and the low speed counter reset output pulse is developed as shown on line (*g*). The low speed counter reset output pulse enables the output gates of the high speed ring counter and, assuming that the zero gate is also enabled by ring counter 76, an output pulse from the divider is developed as shown on line (k). It should be noted that the first divider output pulse in this example occurred 30 pulses after the beginning of the count. Since it is not possible to preset the divider to achieve the exact ratio desired on the first counting period this counting period is used to synchronize all the circuits in the divider to achieve the desired ratio during the subsequent counting periods.

At the fortieth count the inhibit pulse is removed and the low speed counter again counts as shown in line (*d*). At count 50 the terminal pulse is again generated and the counter goes through the cycle previously described. However, ring counter 76 has been advanced three counts in the manner previously described in connection with the description of FIG. 3 and the output pulse occurs three counts after the low speed counter reset output pulse is developed or at pulse 73. Pulse 73 is 43 pulses after pulse 30 is desired.

The next advance of ring counter 76 causes the ring counter to count from 3 to 4, 4 to 0, 0 to 1 developing a ring advance correction pulse shown on line (*h*). This pulse enables gate 86 so that a clock pulse from clock 82 shifts J–K flip-flop 88 to its "1" state. J–K flip-flop 88 in its "1" state enables gate 90 and causes J–K flip-flop 91 to be shifted to its "1" state in a manner previously described. J–K flip-flops 91 and 88 remain in their "1" state for one five count period and are then returned to their "0" state and the divide by two counter continues operation as before. Referring to line (*b*) it should be noted that the output of J–K flip-flop 34 did not shift after a five count period thereby adding an additional five counts to the number counted by the low speed counter. The terminal, inhibit, clear, set and low speed counter reset output pulses are developed as previously described. During this counter period the output occurs one count after the low speed counter reset output pulse is developed, that is at count 116. Again, the interval between counts 73 and count 116 is 43 counts as desired.

At the beginning of this counting time period ring counter 76 is advanced an additional three counts, that is from 1 to 2, 2 to 3 and 3 to 4. Since the ring counter does not pass through zero during this period the additional five counts are not added and the output occurs four counts after the low speed counter reset output pulse is developed, that is at count 159. Again this is 43 pulses from the previous pulse 116. This operation continues with the interval between the pulses alway being 43 pulses as desired.

Figure 5:
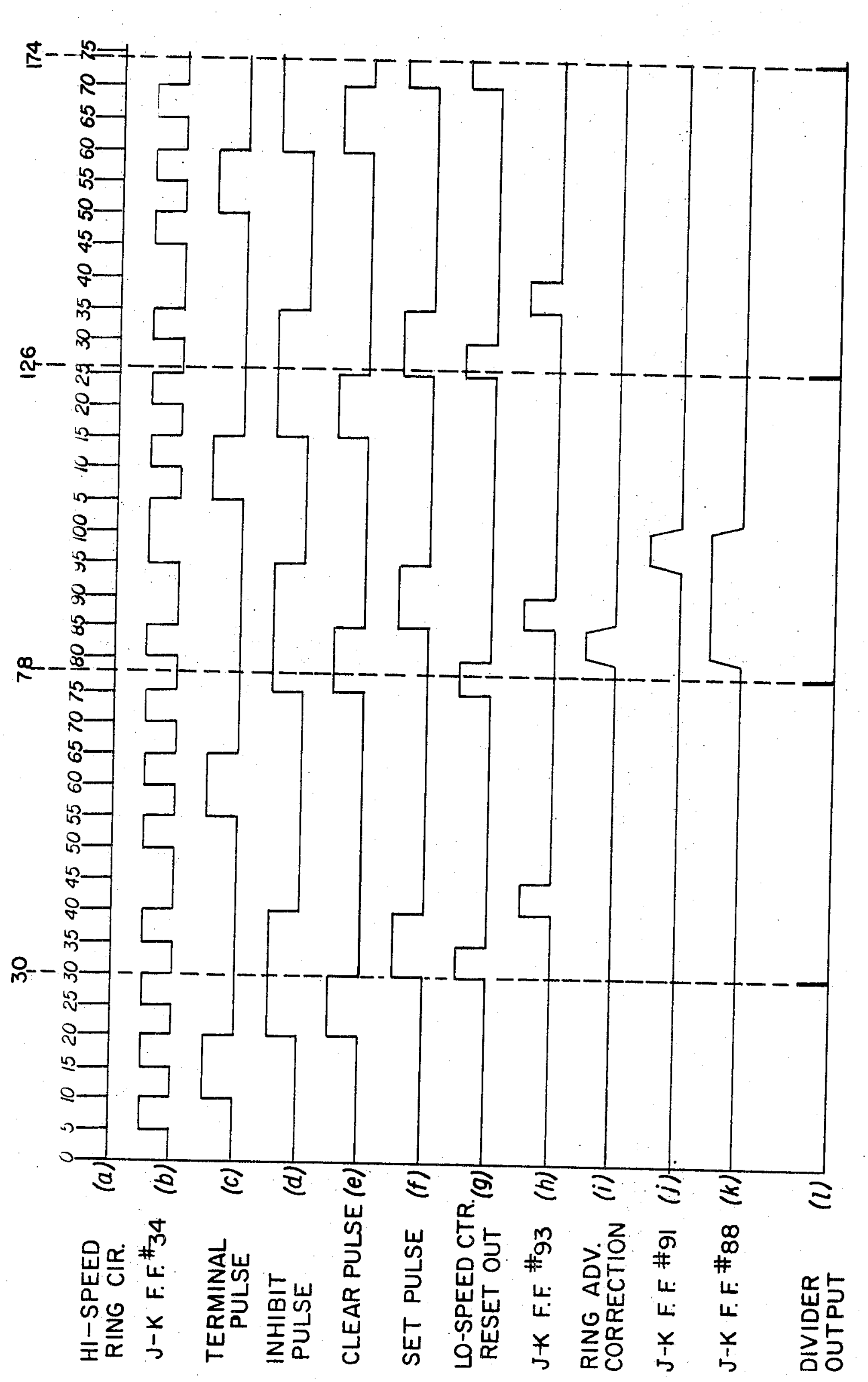

In FIG. 5 there are shown timing diagrams illustrating the operation of the circuitry when the division ratio ends in a number between 5 to 9 inclusive. In this example the division ratio has been chosen as 48. As previously described the operation of the divider for the first 30 counts in this example acts to establish the counter in the proper condition and therefore the first count will not necessarily occur at the desired position. At the end of the set pulse shown on line (*f*) a signal is coupled through division ratio selector ratio switch 94, which is closed when a division ratio ending in 5 to 9 is selected, to enable gate 92. As J–K flip-flop 34 goes from its "1" to its "0" state a signal is coupled through gate 92 to J–K flip-flop 93 shifting it to its "1" state, as shown on line (*h*). With J–K flip-flop 93 in its "1" state the following count pulse, that is pulse 45 from high speed ring counter 33, will not shift J–K flip-flop 34 back to its "1" state. However, this same count pulse from high speed ring counter 33 shifts J–K flip-flop 93 to its "0" state as shown on line (*h*). The following count pulse from high speed ring counter 33 shifts J–K flip-flop 34 to its "1" state and J–K flip-flop 34 then toggles as previously described. Thus an additional five counts has been added to the count during each counting period since the low speed counter operates in response to an output from J–K flip-flop 34 and its operation has been delayed by five input counts.

In the following counting period, pulses 78 to 126, the shifting of J–K flip-flop 91 from its "0" to its "1" state is delayed for five counts since it operates in response to a shifted J–K flip-flop 34 from its "0" to its "1" state. The operation of J–K flip-flop 91 produces an additional five count delay as previously described in connection with FIG. 4. As can be seen in line (*d*) a five count delay, required because the count ends in an 8, its introduced from count 45 to count 50, from count 90 to count 95 and from count 140 to 145. An additional five count delay, required because ring counter 76 is advanced through zero, is added from count 100 to count 105. Thus it can be seen the output pulse on line (*l*) occurs every 48 counts, that is at counts 78, 126 and 174 in this example.

The terms high speed counter and low speed counter as used in this application are relative terms and are not used to limit the operating speeds of either counter. In dividers incorporating the features of this invention, input signals having frequencies of 100 megacycles have been divided. In a divider operation at this frequency, the high speed counting means would count at a 100 megacycle rate while the low speed counting means would count at only a 10 megacycle rate. Since the high speed counting means counts continuously the maximum counting rate of the divider is not limited by the requirement of starting, stopping and resetting the high speed counting means. The invention is not limited to frequencies of 100 megacycles and may be used at the speeds as high as can be obtained by the components available.

We claim:

1. A frequency divider for developing an output signal in response to a predetermined number of input pulses, said divider including in combination, continuously operated first counting means adapted to receive the input signals and having a plurality of stages energized in a repeating sequence in response to the input signals, one of said plurality of stages acting to generate a count pulse upon each energization thereof, second counting means coupled to said one stage for receiving said count signals and being responsive to a particular number thereof to develop a terminal signal, and output selection means coupled to said second counting means and to each of said plurality of stages and being responsive to said terminal signal to develop the output signal in response to energization of a predetermined stage of said plurality of stages, said output selection means including selection control means coupled to said second counting means and to each of said plurality of stages for selecting said predetermined stage in response to said terminal signal, and advance control means coupled to said selection control means, said advance control means being responsive to the output signal to advance the stage selected as said predetermined stage by a particular number of stages.

2. The frequency divider of claim 1 and further including, division ratio control means coupled to said second counting means and said advance control means, said division ratio control means being adjustable to change said particular number of count signals required to develop said terminal signal, said division ratio control means further being adjustable to change said particular number of stages by which the stage selected as said predetermined stage is advanced after each output signal.

3. A frequency divider for developing an output pulse in response to a predetermined number of input pulses, said frequency divider including in combination, continuously operated first counting means adapted to receive the input pulses and having a plurality of stages energized in a repeating sequence in response to the input pulses including a count pulse stage acting to generate a count pulse upon each energization thereof, said first counting means further having a plurality of output circuits separately coupled to each of said plurality of stages, second counting means adapted to be preset to a particular starting number and to develop a terminal pulse upon counting to a particular terminal number, said second counting means being coupled to said count pulse stage and being responsive to said count pulses to count from said particular starting number to said particular terminal number, count termination means coupled to said count pulse stage and said second counting means, said count termination means being responsive to said count pulses and said terminal pulse to stop and preset said second counting means to said particular starting number and to restart said second counting means, said count termination means further being responsive to said count pulses and said terminal pulse to develop a selection pulse a desired number of count pulses after said terminal pulse, output selection means coupled to said plurality of output circuits and said count termination means and responsive to said selection signal to energize a predetermined one of said output circuits to thereby develop the output signal in response to the energization of said stage coupled to said predetermined one of said output circuits.

4. The frequency divider of claim 3 further including, advance control means coupled to said output selection means, and said output circuits, said advance control means being responsive to the output signal to advance the output circuit selected as said predetermined output circuit by a particular number of output circuits.

5. The frequency divider of claim 4 and further including, division ratio control means coupled to said second counting means and said advance control means, said division ratio control means being adjustable to change the number of said count signals required to develop said terminal pulse, said division ratio control means further being adjustable to change said particular number of output circuits by which the output circuit selected as said predetermined output circuit is advanced after each output signal.

6. The frequency divider of claim 5 wherein, said advance control means includes, clock means, cyclic counting means coupled to said clock means and having a plurality of registers energized in a repeating sequence in response to clock pulses applied thereto, one of said plurality of registers acting to generate a stop pulse upon each energization thereof, said cyclic counting means further being coupled to said output selection means and said division ratio control means and being responsive to the output pulse to advance the output circuit selected as said predetermined stage by said particular number of output circuits, pulse inhibiting means coupling said count pulse stage to said second counting means and further being coupled to said one of said plurality of registers for receiving said stop pulse, said pulse inhibiting means being responsive to said stop pulse to prevent transfer of one of said count pulses to said second counting means.

7. A frequency divider for developing an output pulse in response to a predetermined number of input pulses, said frequency divider including in combination, continuously operated high speed ring counting means adapted to receive the input pulses and having a plurality of stages energized in a repeating sequence in response to the input pulses including a count pulse stage acting to generate a count pulse upon each energization thereof, said high speed ring counting means further including a plurality of output gates separately coupled to each of said plurality of stages, low speed counting means adapted to be preset to a particular starting number to develop a terminal pulse upon counting to a particular terminal number, divide by two counting means coupled to said low speed counting means, count pulse inhibiting means coupling said count pulse stage to said divide by two counting means, said divide by two counting means being responsive to said count pulses to transfer every second one thereof to said low speed counting means, said low speed counting means being responsive to said count pulses coupled thereto to count from said starting number to said terminal number, count termination means coupled to said divide by two counting means and said low speed counting means, said count termination means being responsive to said count pulses and said terminal pulse to stop and preset said low speed counting means to said particular starting number and to restart said low speed counting means, said count termination means further being responsive to said count pulses and said terminal pulses to develop a selection pulse a desired number of count pulses after said terminal pulse, output selection means coupled to said plurality of output gates and said count termination means and responsive to said selection signal to energize a predetermined one of said output gates to thereby develop the output signal in response to the energization of said stage coupled to said predetermined one of said output gates.

8. The frequency divider of claim 7 wherein, said output selection means includes advance control ring counter means having a plurality of registers equal in number to the number of stages in said high speed ring counting means and energized in a repeating sequence in response to advance control pulses applied thereto, advance control pulse generating means coupled to said plurality of output gates and said advance control ring counter means, said advance control pulse generating means being responsive to the output pulse to generate a predetermined number of said advance control pulses, for advancing said energized register of said advance control ring counter means by a predetermined number of registers equal to said predetermined number of pulses, first circuit means coupling each of said registers of said advance control ring counter means to a separate one of said output gates, each of said registers of said advance control ring counter means acting, while in an energized condition, to apply an enabling pulse to the output gate coupled thereto, second circuit means coupling a particular one of said registers of said advance control ring counter means to said count pulse inhibiting means, said count pulse inhibiting means being responsive to said particular one register of said advance control ring counter means in an energized state to block one of said count pulses from said divide by two counting means.

9. The frequency divider of claim 8 further including, division ratio control means coupled to said low speed counting means and said advance control pulse generating means, said division ratio control means acting to set said particular starting number and to set said predetermined number of said advance control pulses, said division ratio control means being adjustable whereby said particular starting number and said predetermined number of said advance control pulses are varied to thereby vary the number of input pulses required to develop the output pulse.

10. The frequency divider of claim 9 wherein, said high speed ring counting means has five stages, and further including 5 to 9 reset means coupled to said count pulse inhibiting means and said division ratio control means, said 5 to 9 reset means acting to block one count pulse during each count period with said division ratio control means set so that the number of input pulses required to develop the output pulse ends in 5 to 9 inclusive.

References Cited

UNITED STATES PATENTS

| | | | |
|---|---|---|---|
| 3,263,174 | 7/1966 | Bjorkman et al. | 328—25 |
| 3,375,449 | 3/1968 | Ribour et al. | 328—46 X |
| 3,376,546 | 4/1968 | Cress et al. | 328—48 X |
| 3,420,990 | 1/1969 | Andrea et al. | 307—220 X |
| 3,456,200 | 7/1969 | Bos | 328—48 |

STANLEY D. MILLER, Primary Examiner

U.S. Cl. X.R.

235—92; 307—220, 225; 328—41, 48